United States Patent [19]
Pawlowski et al.

[11] Patent Number: 5,301,299
[45] Date of Patent: Apr. 5, 1994

[54] OPTIMIZED WRITE PROTOCOL FOR MEMORY ACCESSES UTILIZING ROW AND COLUMN STROBES

[75] Inventors: Stephen Pawlowski; Peter D. MacWilliams, both of Aloha, Oreg.

[73] Assignee: Intel Corporation, Santa Clara, Calif.

[21] Appl. No.: 20,184

[22] Filed: Feb. 16, 1993

Related U.S. Application Data

[63] Continuation of Ser. No. 534,754, Jun. 7, 1990, abandoned.

[51] Int. Cl.⁵ .............................................. G06F 12/08
[52] U.S. Cl. .............................. 395/425; 364/DIG. 1; 364/243.41
[58] Field of Search ... 364/200 MS File, 900 MS File; 395/425

[56] References Cited

U.S. PATENT DOCUMENTS

| | | | |
|---|---|---|---|
| 4,096,569 | 6/1978 | Barlow | 395/325 |
| 4,316,244 | 2/1982 | Grondalski | 364/200 |
| 4,516,199 | 5/1985 | Frieder et al. | 395/275 |
| 4,627,018 | 12/1986 | Trost et al. | 395/425 |
| 4,835,672 | 5/1989 | Zenk et al. | 395/425 |
| 4,839,796 | 6/1989 | Rorden et al. | 395/425 |
| 4,847,758 | 7/1989 | Olson et al. | 395/425 |
| 4,918,645 | 4/1990 | Lagoy, Jr. | 395/425 |
| 5,022,044 | 6/1991 | Kurtze et al. | 365/189.07 |
| 5,034,917 | 7/1991 | Bland et al. | 395/425 |
| 5,041,964 | 8/1991 | Cole et al. | 395/425 |
| 5,111,386 | 5/1992 | Fujishima et al. | 395/425 |

Primary Examiner—Joseph L. Dixon

[57] ABSTRACT

An improved method for accessing memory in a computer system using standard fast paged mode memory access for a second memory access where the second memory access is pending at the completion of a first memory access. However, if at the completion of a first memory access there is no pending memory request, the RAS line of the memory is deactivated allowing precharge during an idle state on the bus.

10 Claims, 4 Drawing Sheets

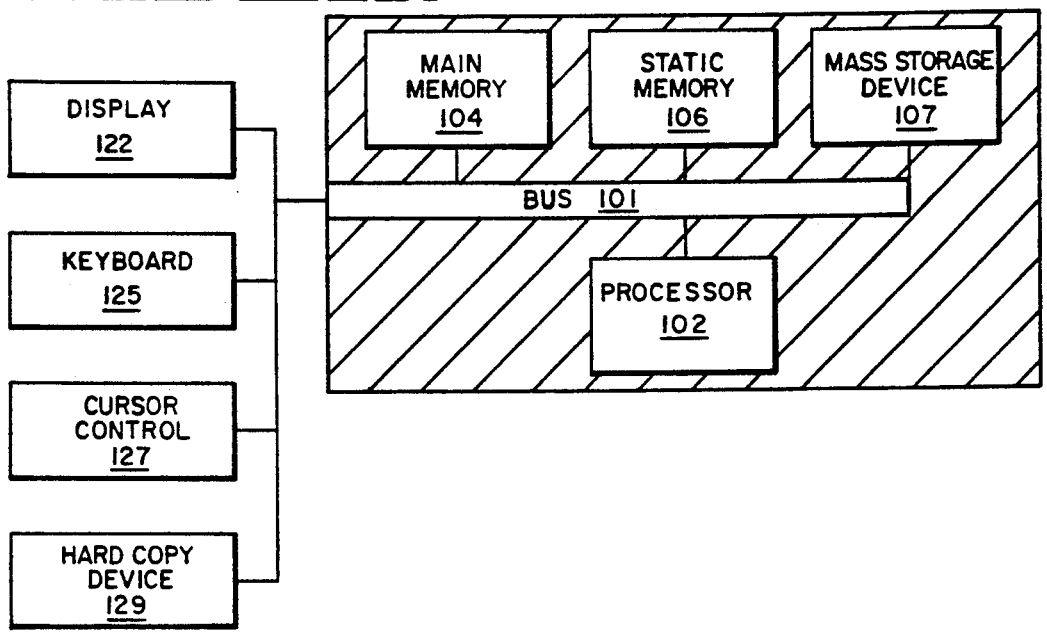
FIG_1A
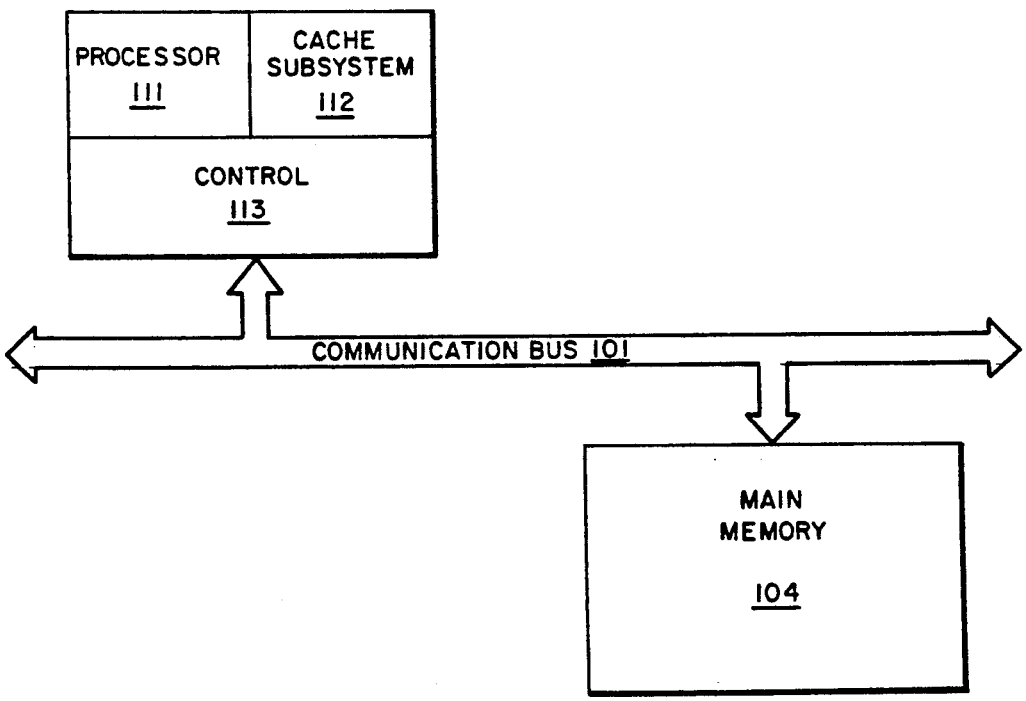
FIG_1B

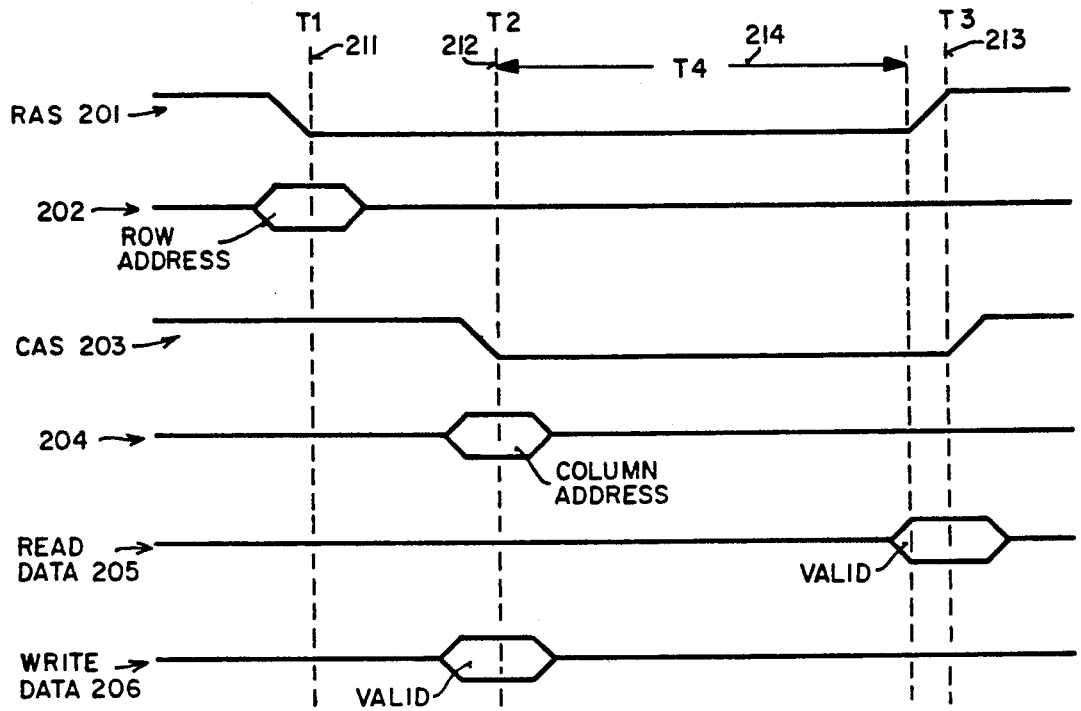
FIG_2 (PRIOR ART)
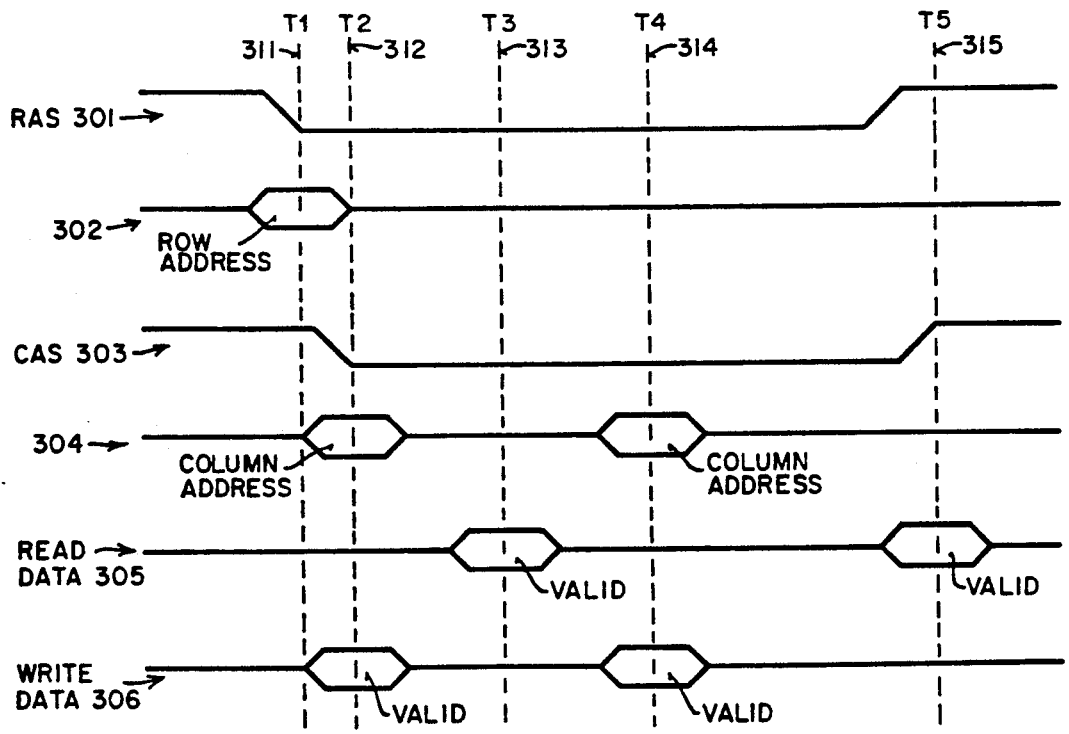
FIG_3 (PRIOR ART)

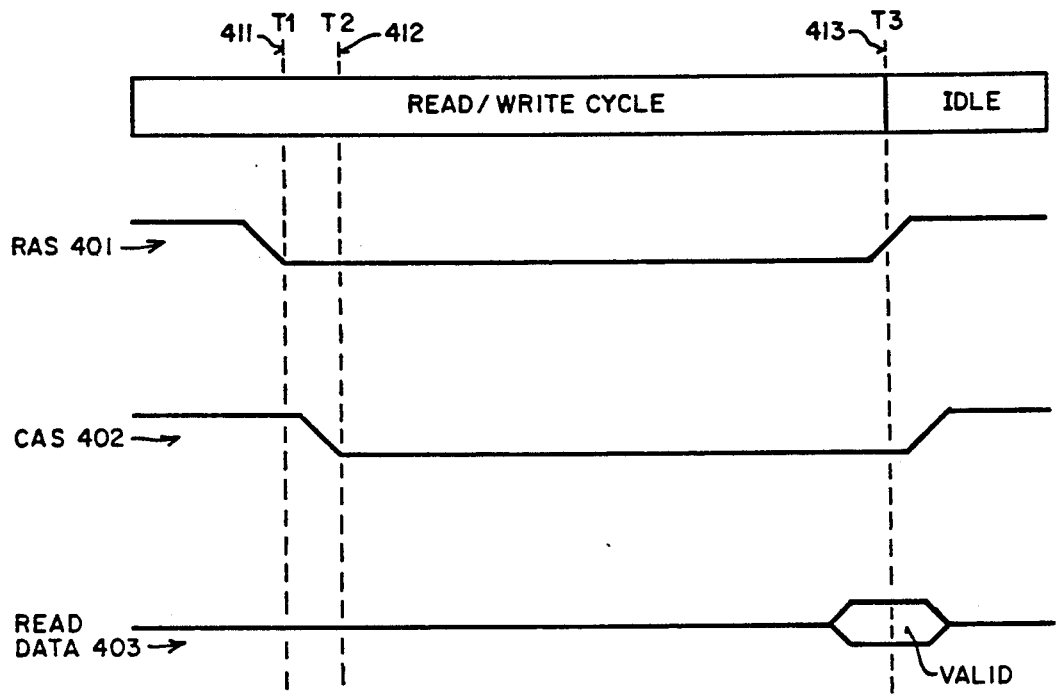
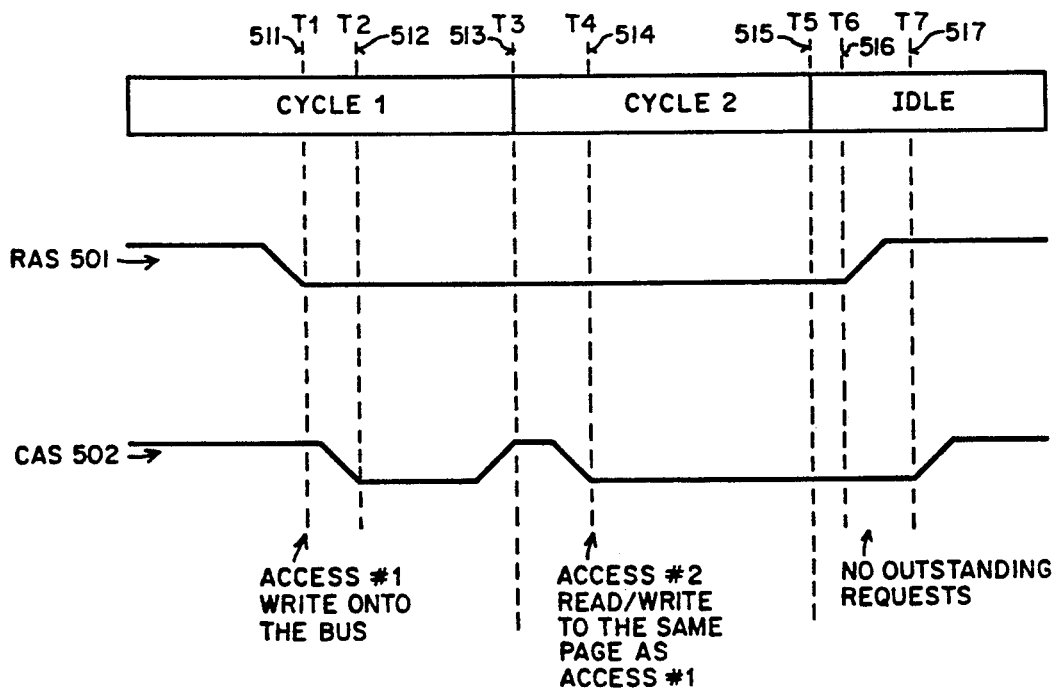

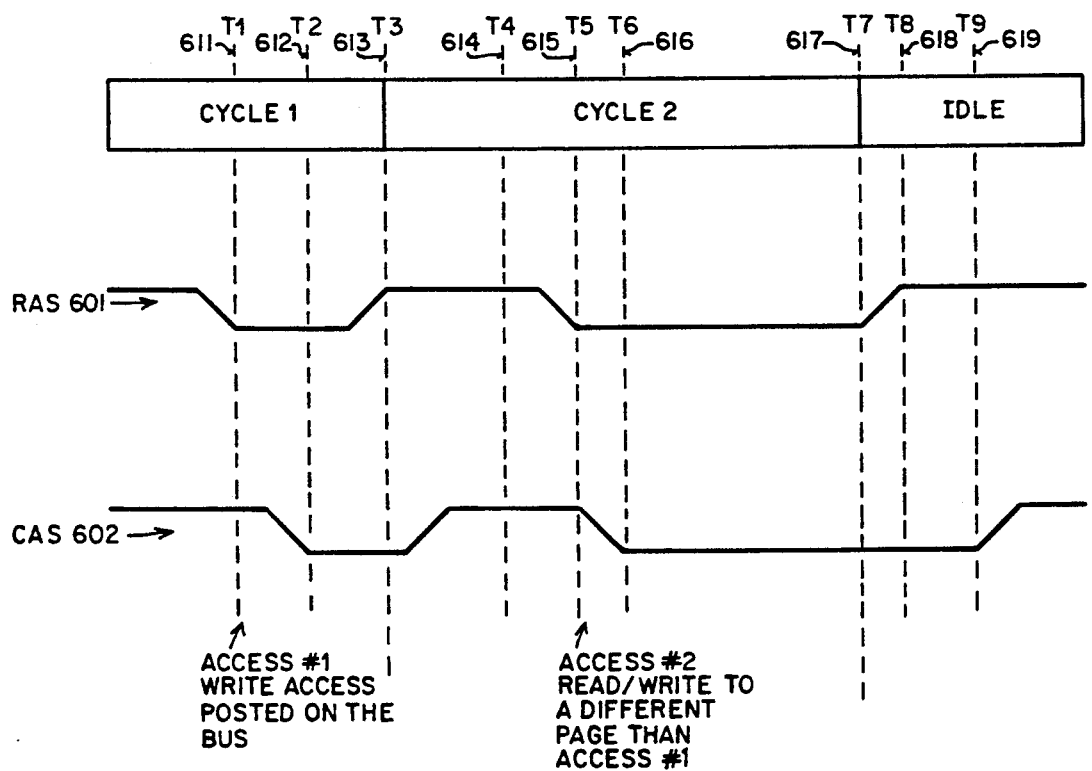
FIG_6

OPTIMIZED WRITE PROTOCOL FOR MEMORY ACCESSES UTILIZING ROW AND COLUMN STROBES

This is a continuation of application Ser. No. 07/534,754, filed Jun. 7, 1990 now abandoned.

BACKGROUND OF THE INVENTION

1. Field of the Invention

The present invention relates to write protocols for memory accesses and, more specifically, to an optimized protocol for writing to memories having a fast paged mode memory access capability.

2. Description of the Related Art

Computer architects have long struggled to overcome the data transfer bottleneck which has plagued von Neumann architectures. For example, cache memories have been utilized to store information in high speed memories allowing faster access to such information by a processor. Also, DRAM memory devices have improved technologically in density, in speed, and by offering additional modes for accessing data.

In a typical instruction stream the ratio of read accesses to write accesses is on the order of 4:1. Thus, a main memory subsystem must optimize the read transfer rate to provide for optimal performance. However, in a system utilizing a write-through cache memory, the ratio of read accesses to write accesses from main memory has decreased and in such systems, it is important to consider optimal performance of write accesses as well as read accesses. One known method of providing for optimal write accesses is through "posting" of write accesses. This is a process in which a write access is initiated on a system bus by a processor and then the processor is freed to execute other instructions without the need to wait for the completion of the write access to main memory.

The present invention relates to systems utilizing known standard RAS/CAS memory access methods. These methods are well known to one of ordinary skill in the art and essentially may be described as a memory access method in which a row address is provided on a bus to a memory device and a row address strobe (RAS) line is activated when the row address is available for the memory. Similarly, a column address is provided on the bus and a column address strobe is activated when the column address is available for the memory. At completion of the memory access, the RAS and CAS lines are deactivated. At this time the row address lines and column address lines may be precharged in preparation for the next memory access. As is understood, if there is a pending access request, overhead is incurred while waiting for precharge of the RAS and CAS lines. Standard RAS/CAS memory accesses are described in greater detail below with reference to FIG. 2.

One known variation of the standard RAS/CAS memory access scheme is termed "fast paged mode". In fast paged mode, the RAS line is deactivated only when a subsequent memory access is to a different memory page (i.e., row address) than the first memory access or when a memory refresh cycle occurs. Fast paged mode avoids overhead associated with precharging RAS lines prior to accessing the memory device where the subsequent access is to the same row address. Fast paged mode is described in greater detail with reference to FIG. 3.

In most applications, the RAS line, once activated, remains activated even if the bus is idle in anticipation of a DRAM page hit from a subsequent access. As will be appreciated from the Detailed Description of the Preferred Embodiment, the present invention utilizes an improved protocol to access DRAM memory in which the RAS line is held active only if another access is pending and the access is a hit to the same DRAM page as the immediately previous access. In all other cases the RAS line is deactivated.

This application also relates to co-pending U.S. patent application Ser. No. 07/292,476 filed Dec. 30, 1988, titled Request/Response Protocol which is assigned to the assignee of the present invention (the '476 reference) now abandoned. The present application further relates to U.S. patent application Ser. No. 07/292,566 filed Dec. 30, 1988, titled Self-identification of Memory which is assigned to the assignee of the present application (the '566 reference) now abandoned. Finally, the present application relates to U.S. patent application Ser. No. 07/403,174 filed Sep. 5, 1989, now U.S. Pat. No. 5,239,638 titled Two Strobed Memory Access which is assigned to the assignee of the present invention (the '174 reference) and which is a continuation of U.S. patent application Ser. No. 07/292,476. The teachings of the '476 reference, the '566 reference, and the '174 reference are all incorporated herein by reference.

OBJECTIVES OF THE PRESENT INVENTION

As one objective of the present invention, it is desired to provide for optimizing of memory accesses in a computer system.

As a second objective of the present invention, it is desired to provide for optimizing of write accesses in a computer system which includes posted write cycles.

As a third objective of the present invention, it is desired to provide for optimizing of write accesses in a computer system utilizing a fast paged memory mode.

These and other objects of the present invention will be better understood with reference to the below description and the accompanying figures.

SUMMARY OF THE INVENTION

The present invention discloses an improved memory access method which is particularly useful in systems providing fast paged mode memory access capability. In the method of the present invention, if upon completion of a first memory access, there is pending a second memory access, the system of the present invention operates in accordance with the standard methods for fast paged mode memory accesses. That is to say that, if the second memory access is to the same page as the first memory access, the RAS line is held active and the new column address information is provided for the access. If the second memory access is to a different page than the page accessed by the first memory access, the new row address information is supplied and the associated overhead with RAS precharging is incurred.

If there is not a pending request upon completion of the first memory access, the present invention offers the inventive advantage of deactivating the RAS line and beginning the RAS precharge period. In this way, the overhead associated with precharging will be incurred during an idle period on the bus. This method avoids potential precharge overhead during an active bus cycle.

This and other advantages of the present invention will be described in greater detail below with reference to the Detailed Description of the Preferred Embodiment and the accompanying figures.

BRIEF DESCRIPTION OF THE DRAWINGS

FIG. 1(A) is a block diagram illustrating portions of a computer system.

FIG. 1(B) is a block diagram illustrating portions of a computer system that may operate to utilize the method of the present invention.

FIG. 2 is a timing diagram illustrating a prior art method for accessing a memory termed "standard RAS/CAS mode".

FIG. 3 is a timing diagram illustrating a prior art method of fast paged mode access for accessing a memory as may be utilized by the present invention.

FIG. 4 is a timing diagram illustrating a method of access for the optimized protocol of the present invention wherein a first access is followed by an idle state on a memory bus.

FIG. 5 is a timing diagram illustrating a method of a write access followed by another access to a same page of memory as may be utilized by the present invention.

FIG. 6 is a timing diagram illustrating a method of a write access followed by another access to a second page of memory as may be utilized by the present invention.

DETAILED DESCRIPTION OF THE PREFERRED EMBODIMENT

An optimized protocol for writing to memories is described. In the following description, numerous specific details are set forth such as specific circuits, etc., in order to provide a thorough understanding of the present invention. It will be obvious, however, to one skilled in the art that the present invention may be practiced without these specific details. In other instances, well-known circuits, structures and techniques have not been shown in detail in order not to unnecessarily obscure the present invention.

OVERVIEW OF THE COMPUTER SYSTEM OF THE PRESENT INVENTION

Referring first to FIG. 1(A), an overview of a computer system of the present invention is shown in block diagram form. It will be understood that while FIG. 1(A) is useful for providing an overall description of the computer system of the present invention, a number of details of the system are not shown. As necessary for disclosure of the present invention, further detail is set forth with reference to the other figures provided with this specification. Further, the present invention is described with reference to its preferred embodiment; alternative embodiments which may be conceived by one of ordinary skill in the art are considered within the scope of the claims set forth below.

The present invention may be implemented on a general purpose microcomputer, such as one of the members of the IBM Personal Computer family, one of members Apple Macintosh TM family, or one of several work-stations or graphics computer devices which are presently commercially available. Of course, the present invention may also be implemented on a multi-user system while encountering all of the cost, speed and function advantages and disadvantages available with these machines. The preferred embodiment of the present invention is marketed by Intel Corporation of Santa Clara, Calif.

In any event, a computer system as may be utilized by the preferred embodiment generally comprises a bus or other communication means 101 for communicating information, a processing means 102 coupled with said bus 101 for processing information, a random access memory (RAM) or other dynamic storage device 104 (commonly referred to as a main memory) coupled with said bus 101 for storing information and instructions for said processing means 102, a read only memory (ROM) or other static storage device 106 coupled with said bus 101 for storing static information and instructions for said processing means 102, a data storage device 107, such as a magnetic disk and disk drive, coupled with said bus 101 for storing information and instructions, a display device 122, such as a cathode ray tube, liquid crystal display, etc; coupled to said bus 101 for displaying information to the computer user, an alphanumeric input device 125 including alphanumeric and other keys coupled to said bus 101 for communicating information and command selections to said processor 102, and a cursor control device 127, such as a mouse, track ball, cursor control keys, etc; coupled to said bus 101 for communicating information and command selections to said processor 102 and for controlling cursor movement. Finally, it is useful if the system includes a hardcopy device 129, such as a printer, for providing permanent copies of information. The hardcopy device 129 is coupled with the processor 102, main memory 104, static memory 106 and mass storage device 107 through bus 101.

Of course, certain implementations and uses of the present invention may not require nor include all of the above components. For example, in certain implementations hardcopy devices may not be required. In other implementations, it may not be required to provide a keyboard and cursor control device for inputting information to the system. In still other implementations, it may not be required to provide a display device for displaying information.

Certain components of the system of the preferred embodiment are again shown with reference to FIG. 1(B). As can be seen, the processor means, labeled as processor module 102, of the system of the preferred embodiment includes a processor 111, a cache subsystem 112, and a control 113 for controlling accessing between the processor 111, the cache subsystem 112 and the communication bus 101. In the preferred embodiment, the processor 111 comprises one of the 80×86 family of processors available from Intel Corporation of Santa Clara, Calif.

The control 113 includes a communication interface comprising a set of signals that allow the processor module to exchange data with the memory module 104. The memory module 104 comprises a memory array which utilizes fast paged mode components to avoid precharge limitations. Of course, any of a number of commercially available memory modules may be employed.

In the preferred embodiment, the memory array of memory module 104 utilized SIMM technology incorporating any of 256K, 1M or 4M DRAM densities. The topology is 32 bits in total width using, in the preferred embodiment either four ×8(×9) SIMMS (allowing for 1 parity bit per byte) or one ×32(×36) SIMM (allowing 4 parity bits per 32 bit DWORD). Such parts are, of course, commercially available, for example from Toshiba as Part No. TC511000/TC511002 for 1M×1

DRAMs or Part No. TMM41256AP/AT/AZ for 256K×1 bit DRAMs.

In the preferred embodiment, the memory module 104 is capable of operating in two different modes: (1) standard RAS/CAS mode and (2) fast paged mode.

In standard RAS/CAS mode, row addresses are strobed into the memory 104 at the falling edge a row address strobe (RAS) signal and column addresses are strobed into the memory 104 at the falling edge of a column address strobe (CAS) signal. In the case of a read access, after a determined period of time M, data from the access is available on the communication bus 101 to processor module 102. In the preferred embodiment, data is available 114 nanoseconds after the access strobe. Of course, in other embodiments, the specific deterministic period of time may be different dependent on factor such as the address, data and control structures utilized. Further information on the deterministic time period M is available with reference to the '556 and '174 references.

Once the access has been completed, the RAS and CAS signals are strobed inactive. Another access to the memory 104 may not occur until the RAS line has been high (inactive) for a defined period of time. This defined period of time is termed the precharge time. In currently commercially available circuits, the precharge specification for 1M and 4M DRAM technology is typically 60 nanoseconds. In current CMOS technology 256K DRAM technologies, the precharge is specified at 80 nanoseconds. The preferred embodiment of the present invention supports, in one embodiment 256K and higher technologies at 80 nanoseconds and, in another embodiment 1M and higher technologies at 60 nanoseconds.

A write access in standard RAS/CAS mode is similar to the above-described read cycle however, in a write access, the cycle may be shortened because data is not being read from memory and therefore, there is no need to wait for the determined period of time M for the information to become available.

DESCRIPTION OF THE STANDARD RAS/CAS MEMORY ACCESS CYCLE

A standard RAS/CAS memory access cycle is shown in greater detail with reference to FIG. 2. At time t1 211, the RAS signal 201 goes low (brought active). At this time t1 211, a valid row address is being provided on the bus 101 on lines 202 by processing means 102 (or another device which is allowed to make direct memory accesses). At time t2 212, CAS signal 203 is brought active (low). At time t2 212, valid column address information is being provided on the bus 101 (shown as being provided on lines 204) and, in the case of a write transaction, valid data is being provided on the bus 101 (shown as being on data lines 206). In the case of a read transaction, after a determined period of time t4 214, valid data is available on the bus 101 (shown as being provided on data lines 205). At time t3 213, the RAS signal 201 is brought inactive (high) and, thereafter CAS signal 203 is brought high.

Thus, and in summary, access of a memory in standard RAS/CAS mode includes providing a row address (RAS) and column address (CAS) for each memory access cycle.

DESCRIPTION OF FAST PAGED MODE ACCESS IN THE PREFERRED EMBODIMENT

One memory access mode which offers improved access characteristics in certain circumstances is fast paged mode access. In fast paged mode access, memory access is similar to the RAS/CAS memory access. However, when an access is complete, the RAS line is held active in anticipation that the next access will be to the same RAS (row) address in memory. In this way, overhead associated with stobing the RAS line (as in RAS/CAS mode) may be avoided in the second and subsequent accesses to contiguous row addresses in a memory. Subsequent accesses are controlled by transitioning the CAS signal to the memory array. In the case of an access to a different row address, overhead is incurred to precharge the RAS line and then to provide the new row address and again activate the RAS line. In known fast paged mode access methods, the RAS line is held active until an access is attempted to a new row address in the memory or until the next memory refresh cycle. Importantly, the RAS line is held active regardless of whether there is a pending memory access (i.e., the RAS line is held active even if the bus is in an idle state).

As will be understood with reference to FIGS. 4, 5, and 6 and their associated descriptions below, as one inventive advantage of the present invention, the RAS line in the method of the present invention is driven inactive to allow precharging of the row address lines if there is not a pending memory access.

It is recognized by the present invention that a caching structure perturbs the read access rate to main memory. Thus, the locality of references for read accesses may be reduced. For write cycles, especially for write through caches, the write accesses from the processor are reflected through to main memory. It has been observed that the majority of contiguous write cycles from a processor reference the same DRAM memory page. Thus, by posting write cycles, memory control can determine if a subsequent bus cycle is available and if the subsequent bus cycle references the same memory page as the current bus cycle. If no cycle is pending at the end of the current write cycle and the bus transitions to the idle state, it is believed that the page hit rate for subsequent bus cycles will be relatively low. Due to this phenomenom, it is believed that holding the DRAM page active for idle bus cycles will provide an extreme penalty, especially for low page hit rates. Therefore, some portion and possibly all of the overhead penalty associated with precharging the row address lines when changing memory pages is avoided by the method of the present invention by precharging the row address lines when the bus enters an idle state.

A prior art fast paged mode access method is described in more detail with reference to FIG. 3. In FIG. 3, the RAS line 301 is brought active (low) at time t1 311. At this time t1 311, row address information is asserted on the address lines of the bus 101 (shown on lines 302). Subsequently, at time t2 312, the CAS line 303 is brought active (low) and valid column address information is asserted on the address lines of the bus 101 (shown on lines 304). In addition, in the case of a write transaction, valid data is asserted on the data bus (shown as being asserted on write data lines 306). In the case of a read transaction, the memory array is accessed between time t2 312 and time t3 313 and valid read information is available on the bus a deterministic period of time after RAS line 301 and/or CAS line 303 is brought active. The read data is shown as valid at time t3 313 on read data lines 305.

As can be seen, the RAS line 301 is held active after valid data has been transferred on the bus. CAS line 303 is brought inactive at time t3 completing the first memory access cycle. Subsequently, if the next memory access is to the same row address in the memory array, the CAS line 303 is again brought active and valid column address information is asserted at time t4 314. Again, valid data is placed on the bus at time t4 314, in the case of a write transaction, and is written to memory. In the case of a read transaction, valid data is read from the memory and placed on the bus at time t5 315. In either the case of a read access or a write access, the memory is accessed using the row address information which was placed on the bus at time t1 311 and the column address information which was placed on the bus at time t4 314.

As may be observed, the above described memory access method allows for increased efficiency when consecutive accesses to a memory array address the same row in the memory. In many applications there is often a high probability of a second access being to the same memory row as a previous access. This is especially true in computer systems which do not utilize cache memory. However, as one shortcoming of the above-described method, if the next access is not to the same row address, a penalty occurs in the subsequent access to allow a precharge cycle to occur. The precharge cycle is followed by a RAS/CAS access. It is therefore noted that in order for fast paged memory mode to be of significant advantage over standard RAS/CAS memory mode, the page hit rate must be relatively high.

Again, in a system utilizing write through cache memory, it is expected that the cache read hit rate is relatively high. The read high hit rate in such systems is due in large part to the locality of read accesses. However, in a cache based system, the locality of read accesses from main memory is reduced, thereby reducing the memory page hit rate. (The locality of read accesses is reduced in such systems in large part because the cache hit rate is high in a system having sufficient cache memory.) For write accesses to main memory, which tend to have contiguous addresses for consecutive write cycles, there is typically a relatively high page hit rate.

In view of all of the foregoing, the present invention discloses a method and apparatus which optimizes write accesses. The method is especially suited for computer architectures supporting write through caching structures. The method reduces overhead associated with page accesses such as may be caused by a page miss on a read access.

DESCRIPTION OF THE OPTIMIZED ACCESS METHOD OF THE PREFERRED EMBODIMENT

Read Accesses/Write Access with No Subsequent Pending Access

The method of the preferred embodiment is described in detail below and with reference to FIGS. 4, 5 and 6. Referring first to FIG. 4, a read access is illustrated in which a first memory access is followed by an idle state on the memory bus. Read accesses in the preferred embodiment utilize standard RAS/CAS access cycles as illustrated in connection with FIG. 2. Specifically, and referring to FIG. 4, RAS line 401 is activated at time t1 411 (FIG. 2 illustrates that row address signals are provided on the bus at the time the RAS line 401 is activated). CAS line 402 is activated at time t2 412 (and, as illustrated by FIG. 2, column address information is provided on the bus at the time the CAS line is activated). Valid data is then provided by the processor on the bus a determined period of time after the CAS lines is activated (i.e., at time t3 413).

In the preferred embodiment, read accesses are not posted until the access is complete (i.e., the processor may not continue to execute a subsequent instruction until the read access is complete). This is because it is assumed that the processor requires the requested data before processing may continue. Therefore, the bus goes idle and RAS line 401 is inactivated at time t3 413. CAS line 402 is subsequently inactivated and both RAS line 401 and CAS line 402 may then be precharged for the next memory access cycle.

Overview of Write Accesses in the Present Invention

In the preferred embodiment, a write access may be posted to memory (i.e., the processor requests the write access and may then continue processing with the next instruction). If during the time the bus is active with the first write request, the processor makes a second request (either a read or write) to the bus, the second request is checked to determine if the request is for access to the same memory page as the first request. If the request is for the same memory page, then (as will be seen with reference to FIG. 5) the RAS line is held active as in standard fast paged mode. If the access is to a different memory page, the RAS line is inactivated (as will be seen with reference to FIG. 6) and overhead associated with RAS precharging is incurred. (It should be noted similar overhead would be incurred in standard fast paged mode.) The RAS line is then activated and the second memory access cycle is completed.

It may be worth noting that the preferred embodiment provides relatively standard hardware comparison circuitry for comparing a first request with a second request to determine if the second request is for access to the same memory page as the first. The circuitry comprises comparators for comparing the second row address to the first row address. If they are equal, a page hit occurs. If not, then a RAS precharge takes place.

If after posting a write to the bus and while this write is being completed a second memory access is not encountered, the present invention teaches driving the RAS and CAS lines inactive to precharge the devices for the next access. As stated above, it has been found that if a second memory access does not relatively immediately follow a first write access, the probability of the second access requesting the same memory page as the first access is lower than where the second access does relatively immediately follow the first access. Therefore, the method of the present invention avoids the overhead associated with deactivating the RAS line and precharging the device in cases where a second access is posted while a first access is still incomplete. It has been found that this method leads to processing efficiencies over standard fast paged mode accesses of the prior art.

Write Access Followed by a Second Memory Access to the Same Memory Page

Referring to FIG. 5, a write cycle followed by a second memory access followed by an idle period utilizing a method of the present invention is illustrated. (It may be noted that for simplification of the figures, row address lines, column address lines, and data lines have been omitted in certain cases from FIGS. 4, 5, and 6. The function and timing of these lines was explained in greater detail with reference to FIGS. 2 and 3.) At time t1 511 RAS line 501 is activated and at time t2 512 CAS line 502 is activated for a first write request. The first write cycle is completed at time t3 513. Prior to time t3 513, the processor posts a second memory request to the bus and the second memory request is for access to the same memory page as the first write access. In this case, CAS line 502 is deactivated and a new column address is provided on the bus. CAS line 502 is reactivated at time t4 514 and the second memory access is completed at time t5 515. Prior to completion of the second memory access, no new requests are posted to the bus and, therefore, in accordance with the teachings of the present invention RAS line 501 is brought inactive at time t6 516 and CAS line 502 is brought inactive at time t7 517. The row address lines and column address lines may then be precharged for the next memory access.

Write Access Followed by a Second Memory Access to a Different Memory Page

FIG. 6 illustrates a first write access to a first page followed by a second access to a second page. At time t1 611, RAS line 601 is brought active and at time t2 612 CAS line 602 is brought active to begin the first write cycle. Upon completion of the first write cycle at time t3 613, a second memory access is pending on the bus. In this case, the second memory access is to a different memory page than the page accessed by the first access. Therefore, RAS line 601 is brought inactive at time t3 613 and CAS line 602 is brought inactive at time t4 614 so that the row address lines and column address lines may be precharged to accommodate address signals for the second memory access. The RAS line 601 is then brought active at time t5 615 and CAS line 602 is brought active at time t6 616. FIG. 6 again illustrates that, after completion of the second memory access at time t7 617, if there is no pending transaction on the bus RAS line 601 is brought inactive at time t8 618 and CAS line 602 is brought inactive at time t9 619. The row and column address lines of the memory device may then be precharged in preparation for the next memory access.

It may be noted that in certain alternative embodiments, such as a processor which supports a pipeline architecture, the above-described method may apply equally to read accesses followed by a second memory access. A key characteristic of the present invention is that when a second access is pending while a previous access is being completed, the second access to a memory is carried out utilizing a method similar to known fast paged mode. However, if a second access is not pending upon completion of the first access, the memory page is closed by inactivation of the RAS line allowing precharge of the row address lines to occur during an idle period on the bus.

As can be seen, in the case where the bus is idle between memory accesses, the method of the present invention avoids as much of the page miss penalties as possible and therefore offers significant improvement over use of standard RAS/CAS memory accesses or fast paged mode memory accesses known in the art.

Thus, an improved method for accessing memory in a computer system has been described.

What is claimed is:

1. A method for accessing a memory in a computer system, said computer system including a control means for controlling said computer system, said memory, a first line, a second line and at least one address line, said memory means coupled to said first line and said second line, said control means coupled to said first line, said second line and said at least one address line comprising the steps of:
   (a) providing a first row address for a first access to said memory on said at least one address line;
   (b) activating said first line for said first access, said first line for indicating said first row address is available for said memory on said at least one address line;
   (c) providing a first column address for said first access to said memory on said at least one address line;
   (d) activating said second line for said first access, said second line for indicating said first column address is available for said memory on said at least one address line;
   (e) accessing said memory means at a location identified by said first row address and said first column address;
   (f) immediately subsequent to accessing said memory means determining if a second access to said memory is pending, and:
      (i) if said access to said memory is pending, then performing said second access to said memory;
      (ii) else if said second access to said memory is not pending, then deactivating said first line.

2. The method as recited by claim 1 wherein said step of performing said second access to said memory comprises the step of determining if a second row address of said second access to said memory is identical to said first row address of said first access, and:
   (i) if so, deactivating said second line, providing a second column address to said memory on said at least one address line for said second access, activating said second line and accessing said memory means at a location identified by said first row address and said second column address;
   (ii) if not, deactivating said first line, providing said second row address to said memory on said at least one address line for said second access, activating said first line, deactivating said second line, providing said second column address to said memory on said at least one address line for said second access, activating said second line and accessing said memory means at a location identified by said second row address and said second column address.

3. The method as recited by claim 1 further comprising, subsequent to deactivating said first line, the following steps:
   precharging said at least one address line for carrying a second row address;
   deactivating said second line;
   precharging said at least one address line for carrying a second column address.

4. In a computer system having a bus, the bus including a first line, a second line and at least one address line, a processor coupled with the bus, and a memory module also coupled with the bus, wherein the memory module is accessed by the processor over the bus by the processor providing row address information and column address information on said at least one address line, an improved method for accessing the memory, said improved method comprising the steps of:

(a) said processor providing a first row address for a first access to said memory on said at least one address line;

(b) said processor activating the first line for said first access, said first line for indicating said first row address is available for said memory;

(c) said processor providing a first column address for said first access to said memory on said at least one address line;

(d) said processor activating the second line for said first access, said second line for indicating said first column address is available for said memory;

(e) accessing said memory at a location identified by said first row address and said first column address, thus completing said first access to said memory module;

(f) immediately subsequent to said completion of said first access said processor determining if a second access to said memory is pending, and:
   (i) if said second access to said memory is pending, then performing said second access to said memory;
   (ii) else if said second access to said memory is not pending, then deactivating said first line.

5. The improvement as recited by claim 4 further comprising subsequent to deactivating said first line, the steps:
   precharging said at least one address line for carrying a second row address;
   deactivating said second line;
   precharging said at least one address line for carrying a second column address.

6. In a computer system including a control means for controlling the computer system, a memory and a communication medium, said communication medium including a first line, a second line and at least one address line, said at least one address line for providing a row and a column address to said memory, said communication medium coupled to said control means and said memory, a method of performing an access by said control means to said memory comprising the steps of:
   (a) providing a first row address for a first access to said memory on said at least one address line;
   (b) activating said first line for said first access, said first line for indicating said first row address is available for said memory;
   (c) providing a first column address for said first access to said memory on said at least one address line;
   (d) activating said second line for said first access, said second line for indicating said first column address is available for said memory;
   (e) said memory means accessing a memory array element at a location identified by said first row address and said first column address;
   (f) immediately subsequent to said accessing of said memory array element determining if a second access to said memory is pending, and:
      (i) if said second access to said memory is pending, then performing said second access to said memory;
      (ii) else if said second access to said memory is not pending, then deactivating said first line.

7. The method as recited by claim 6 wherein the step of performing said second access to said memory means further comprises the steps of:
   (a) determining if a second row address of said second access to said memory is equal to said first row address;
   (b) if said second row address is equal to said first row address, then:
      (i) deactivating said second line;
      (ii) providing a second column address for said second access to said memory on said at least one address line;
      (iii) activating said second line;
      (iv) accessing a memory element identified by said second row address and said second column address; and
      (v) determining if a next access to said memory is pending for said memory by repeating step (f) of claim 6, said next access to said memory becoming said second access to said memory;
   (c) if said second row address is not equal to said first row address, then:
      (i) deactivating said first line and said second line;
      (ii) completing said second access to said memory by repeating steps a-f of claim 6, said second access to said memory becoming said first access to said memory, said second row address becoming said first row address, and said second column address becoming said first column address.

8. The method as recited by claim 6 further comprising, subsequent to deactivating said first line, the steps:
   said control means precharging said at least one address line for providing said row address to said memory;
   said control means deactivating said second line;
   said memory precharging said at least one address line for providing said column address to said memory.

9. In a computer system including a control means for controlling said computer system, a memory and a communication medium, said communication medium including a first line, a second line and at least one first address line, said at least one first address line for providing row and column addresses to said memory, said communication medium coupled to said control means and said memory, a method of performing an access to said memory comprising the steps of:
   (a) said control means providing a first row address for a first access to said memory on said at least one first address line;
   (b) said control means activating said first line for said first access, said first line for indicating said first row address is available for said memory;
   (c) said control means providing a first column address to said memory on said at least one first address line;
   (d) said control means activating said second line for said first access, said second line for indicating said first column address is available for said memory;
   (e) said memory means accessing a memory array element at a location identified by said first row address and said first column address;
   (f) immediately subsequent to said accessing said memory array element said control means determining if a second access to said memory is pending;
   (g) if said control means determines that said second access to said memory is pending, then performing said second access to said memory;

(h) else if said control means determines that said second access to said memory is not pending, then deactivating said first line.

10. A computer system including a control means for controlling said computer system, a memory and a communication medium, said communication medium including a first line, a second line and at least one first address line, said at least one first address line for providing row and column addresses to said memory, said communication medium coupled to said control means and said memory, an apparatus for performing an access to said memory comprising:
 (a) row address circuitry for providing a first row address for a first access to said memory on said at least one first address line;
 (b) row address strobe (RAS) circuitry for activating said first line for said first access, said first line for indicating said first row address is available for said memory;
 (c) column address circuitry for providing a first column address to said memory on said at least one first address line subsequent to said activation of said at least one first address line and said first line;
 (d) column address strobe (CAS) circuitry for activating said second line for said first access, said second line for indicating said first column address is available for said memory, and for performing said first access;
 (e) processing circuitry for determining if a second access to said memory is pending immediately subsequent to said first access and for performing said second access if so, otherwise for deactivating said first line if no said second access is pending.

* * * * *

UNITED STATES PATENT AND TRADEMARK OFFICE
CERTIFICATE OF CORRECTION

PATENT NO. : 5,301,299

DATED : April 5, 1994

INVENTOR(S) : Stephen Pawlowski, et al

It is certified that error appears in the above-indentified patent and that said Letters Patent is hereby corrected as shown below:

Col. 5, line 7 after "edge" insert --of--.

Col. 6, line 11 delete "stobing" insert in place thereof --strobing--.

Col. 7, line 38 delete "read high" insert in place thereof --high read--.

Claim 1, Col. 10, line 28 after the first occurrence of "said" insert --second--.

Claim 4, Col. 11, line 16 delete "module;" insert in place thereof --means;--.

Delete Drawing sheet 2 of 4, and substitute therefor the Drawing sheet, consisting of Figs. 2 and 3, as shown on the attached pages.

Signed and Sealed this

Tenth Day of October, 1995

Attest:

BRUCE LEHMAN

Attesting Officer

Commissioner of Patents and Trademarks

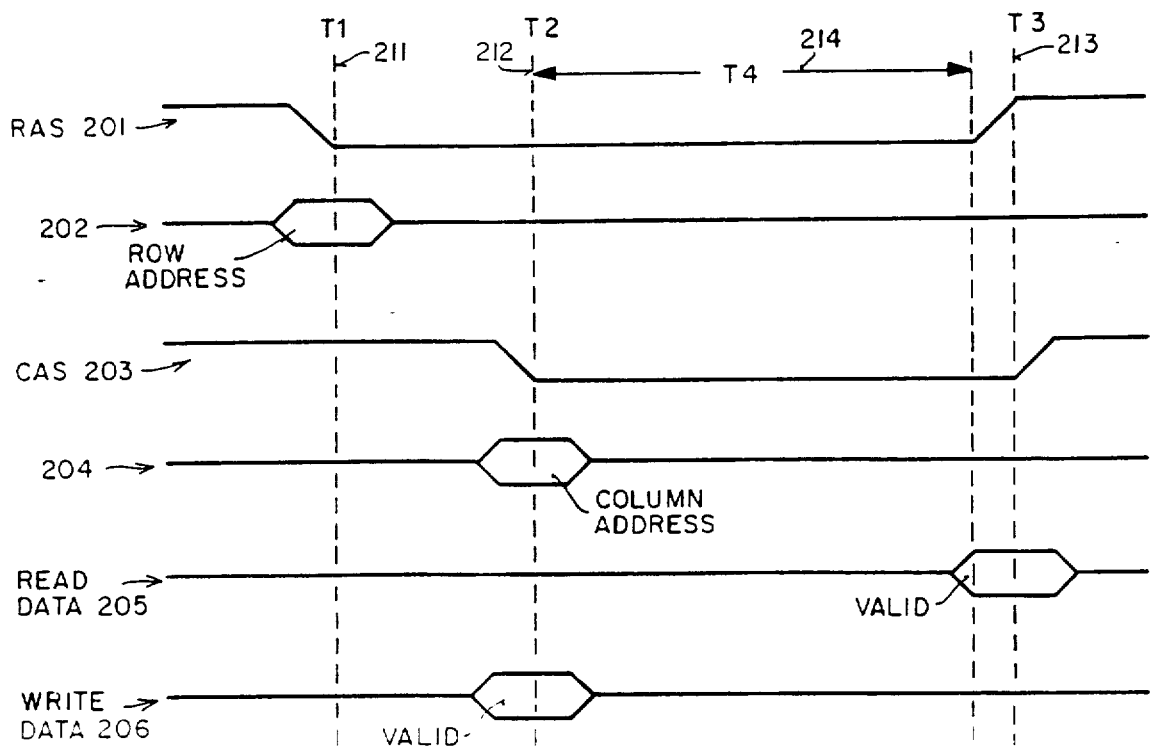
FIG _ 2 (PRIOR ART)
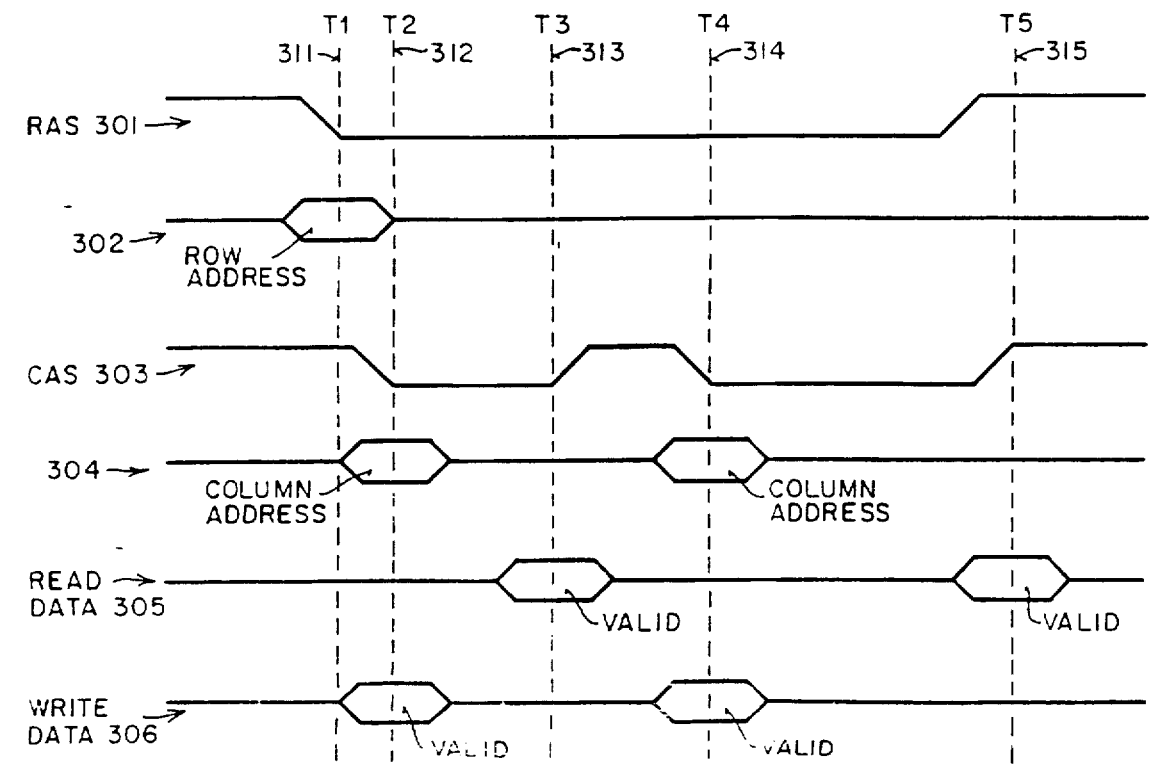
FIG _ 3 (PRIOR ART)